United States Patent [19]

Iwahashi et al.

[11] Patent Number: 4,546,455
[45] Date of Patent: Oct. 8, 1985

[54] SEMICONDUCTOR DEVICE

[75] Inventors: Hiroshi Iwahashi; Kiyofumi Ochii, both of Yokohama, Japan

[73] Assignee: Tokyo Shibaura Denki Kabushiki Kaisha, Kawasaki, Japan

[21] Appl. No.: 446,669

[22] Filed: Dec. 3, 1982

[30] Foreign Application Priority Data

Dec. 17, 1981 [JP] Japan ................... 56-204245
Dec. 17, 1981 [JP] Japan ................... 56-204246
Apr. 12, 1982 [JP] Japan ................... 57-60534

[51] Int. Cl.$^4$ ........................... G11C 11/40
[52] U.S. Cl. ................... 365/200; 365/189
[58] Field of Search .......... 365/174, 182, 189, 200, 365/230

[56] References Cited

U.S. PATENT DOCUMENTS 4,380,804 4/1983 Lockwood et al. ............... 365/184

OTHER PUBLICATIONS

Rahul Sud et al., Electronics; Jul. 28, 1981, pp. 121-126.

Primary Examiner—Terrell W. Fears
Attorney, Agent, or Firm—Finnegan, Henderson, Farabow, Garrett & Dunner

[57] ABSTRACT

A programming circuit used with a semiconductor memory comprising normal as well as spare memory cells allows any of the normal memory cells to be replaced by a spare memory cell and includes a fuse and a MOSFET connected in series between first and second power supply terminals. A voltage signal at the junction between the fuse and the MOSFET is delivered to the gate of the MOSFET after being delayed after power is supplied.

21 Claims, 15 Drawing Figures

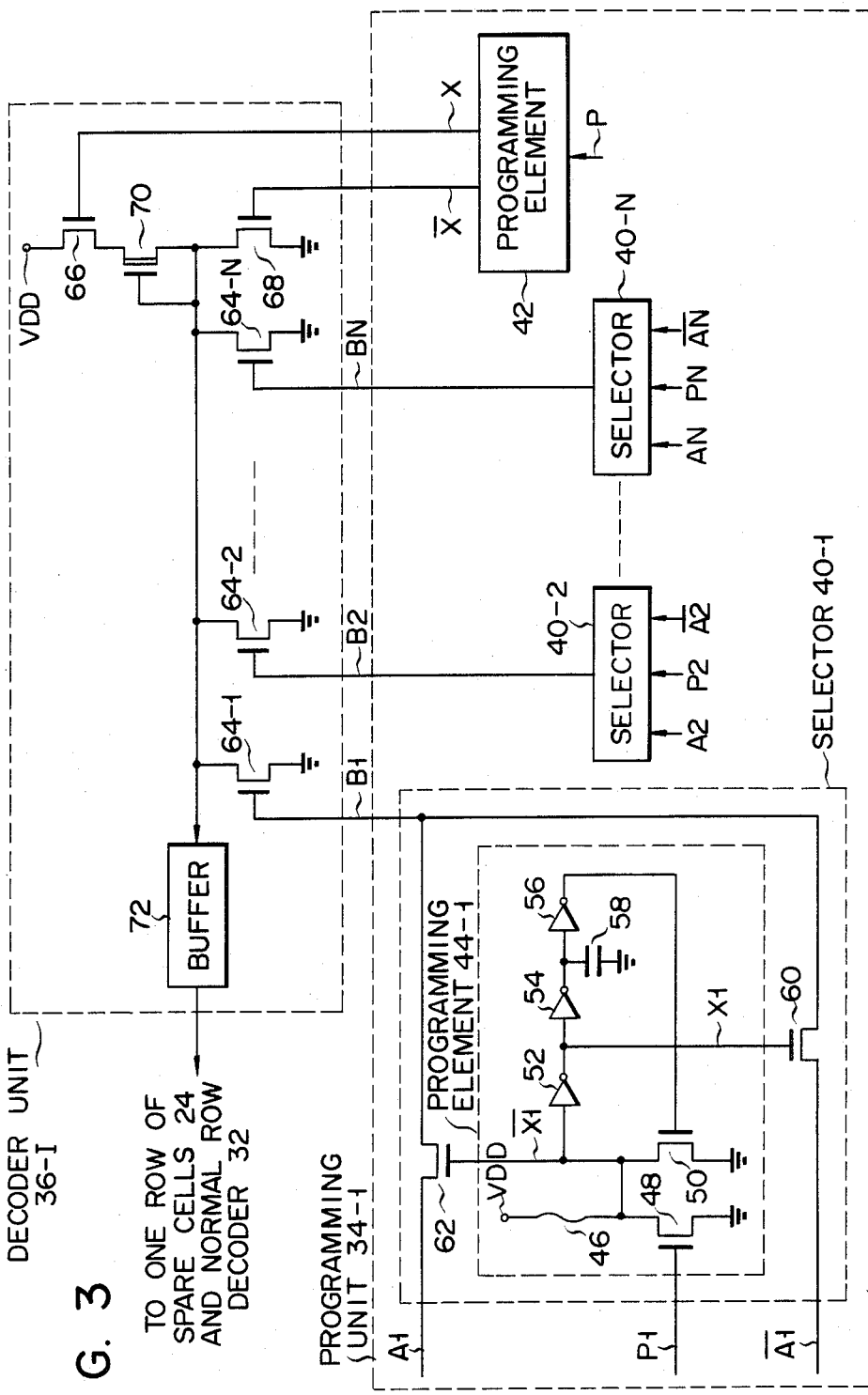
F I G. 3

FIG. 8
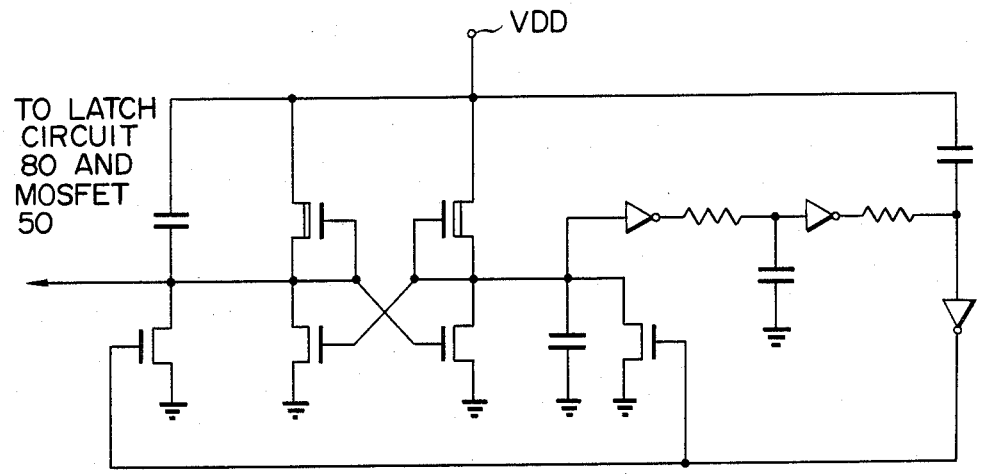
FIG. 9
FIG. 10
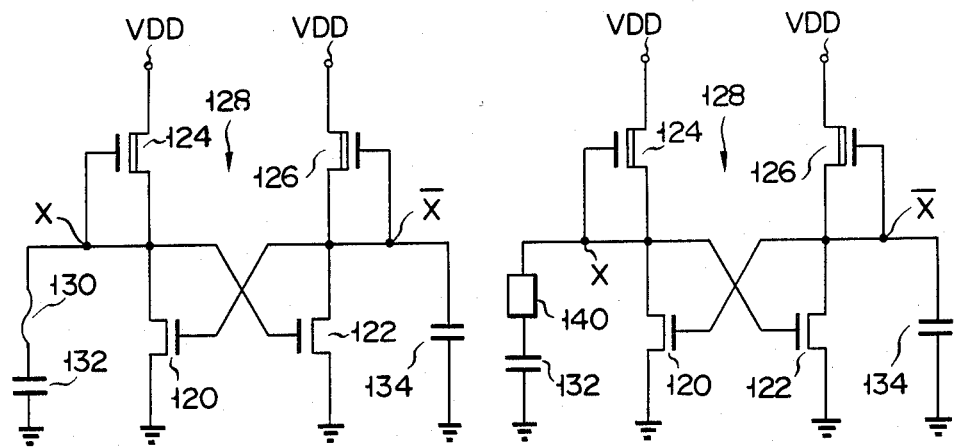

F I G. 12A
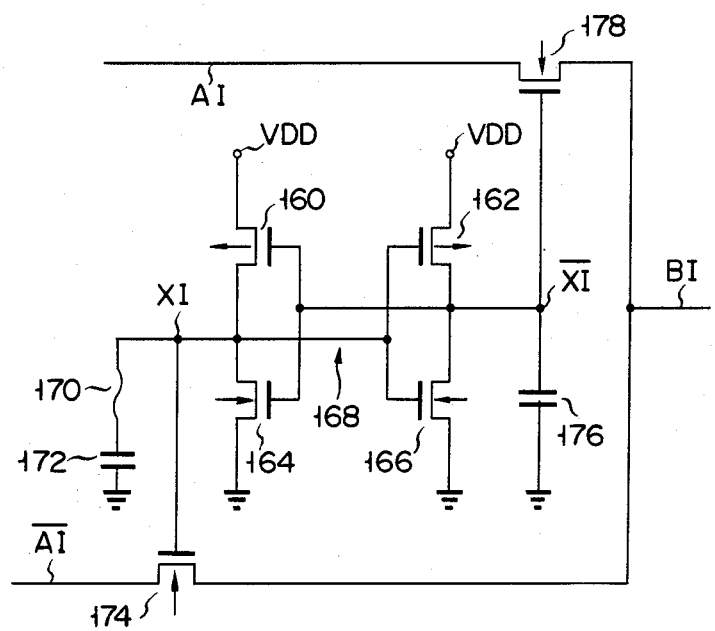
F I G. 12B
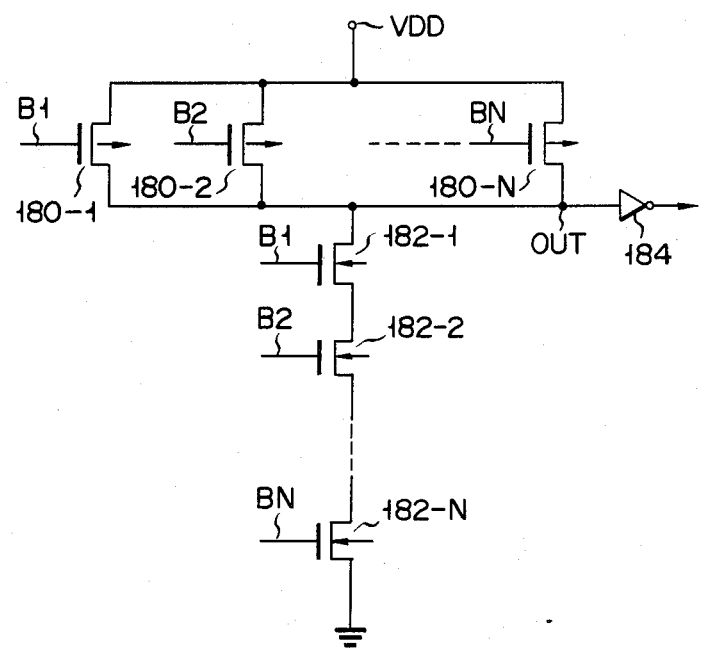

SEMICONDUCTOR DEVICE

BACKGROUND OF THE INVENTION

This invention relates to semiconductor devices and more particularly to semiconductor devices utilizing redundancy techniques.

Recently, semiconductor devices, particularly semiconductor memory devices, comprise a spare device in addition to a normal device. Semiconductor devices utilizing such redundancy techniques have been used with greater frequency. A semiconductor memory which utilizes a redundancy technique comprises spare memory cells in addition to normal memory cells. When a defective bit is detected in one of the normal memory cells after fabrication, the defective memory cell is replaced by a spare memory cell. A semiconductor memory device, even if only one bit is defective, is generally regarded as a substandard device. As the capacity of memory devices increases, defective memory cells tend to occur at a greater frequency. If a memory device in discarded, even though only one bit is found to be defective, the semiconductor memory device would be manufactured with a low yield and at a high cost. It is for this reason that the redundancy technique has been accepted.

To effect replacement of a defective normal memory cell by a spare memory cell data are programmed in a nonvolatile memory element by a programming element. This memory element is commonly prepared from a polysilicone fuse.

FIG. 1A indicates the arrangement of a conventional programming element. A polysilicon fuse 10 is connected between a power supply terminal VDD and an output terminal OUT. Connected in parallel between the output terminal OUT and ground are an enhancement mode MOSFET 12 for programming (unless noted otherwise, the MOSFET is chosen to be an N-channel type) and a depletion mode MOSFET 14. A programming signal P is supplied to the gate of the MOSFET 12, and the gate of the MOSFET 14 is grounded.

With the above-mentioned conventional programming element, binary data is programmed by the blown or connected condition of the polysilicon fuse 10. When, at the time of programming, a programming signal P has a logic level "1", then the MOSFET 12 is rendered conductive, causing current to flow through the fuse 10. At this time, the fuse 10 is blown by the released Joul heat. When the fuse 10 is blown, the output terminal OUT is set at a logic level "0" through the MOSFET 14. Conversely, when a programming signal P has a logic level "0" at the time of programming, then the MOSFET 12 is rendered nonconductive preventing the fuse 10 from being blown. At this time, the output terminal OUT is set at a logic level "1" by the ratio between the resistances of the fuse 10 and MOSFET 14.

FIG. 1B indicates the arrangement of another conventional programming element which produces an output signal having a different level from FIG. 1A. In FIG. 1B, when the fuse 10 is blown, an output signal has a logic level "1". When the fuse 10 is connected, an output signal has a logic level "0".

With the above-mentioned conventional programming element, when the fuse 10 is not blown, current always flows through the fuse 10. The fuse 10 can be blown not only by the passage of current but also by the impingement of laser beams. The fuse 10 is generally made narrow so as to be easily blown. From the standpoint of prescribing the reliability of a programming element, therefore, it is not desirable to let current always run through the fuse. For example, when the power source voltage jumps for some reason, and a large current flows through the fuse 10, the fuse tends to blow.

SUMMARY OF THE INVENTION

It is accordingly the object of this invention to provide a reliable semiconductor device which enables binary data to be stored in a nonvolatile memory element without conducting current therethrough.

To attain the above-mentioned object, this invention provides a semiconductor device which comprises a memory element, in which an impedance prevailing across both terminals is set at a first and second level in a nonvolatile state, and a switching element, both elements being connected in series between first and second power supply terminals, and a control circuit which supplies an output signal from the junction of the memory element and switching element to a control terminal of the switching element through a delay element.

BRIEF DESCRIPTION OF THE DRAWINGS

FIG. 3 shows the detailed arrangement of part of a programming circuit and a spare row decoder included in the semiconductor memory device of FIG. 2;

FIGS. 5 to 8 illustrate various actual circuit arrangements included in the embodiment shown in FIG. 4;

FIG. 9 shows the circuit arrangement of a programming element according to yet another embodiment of the present invention;

FIGS. 10 and 11 show modifications of the circuit arrangement of the embodiment in FIG. 9;

FIGS. 12A and 12B respectively illustrate the arrangements of a programming circuit and a spare decoder according to another embodiment of the invention.

DETAILED DESCRIPTION OF THE PREFERRED EMBODIMENTS

Figure 1A:
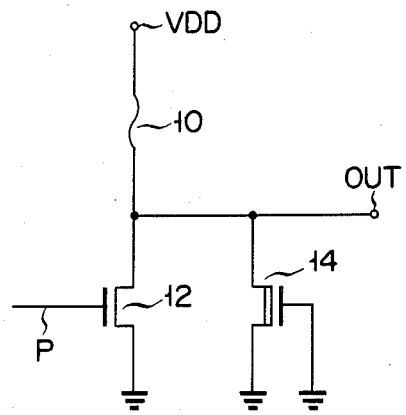
FIGS. 1A and 1B show the circuit arrangements of conventional programming elements using a fuse.
Figure 1B:
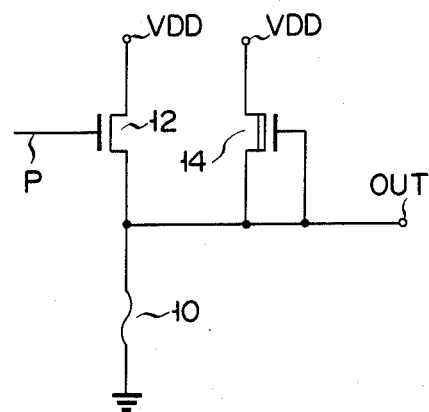
Figure 2:
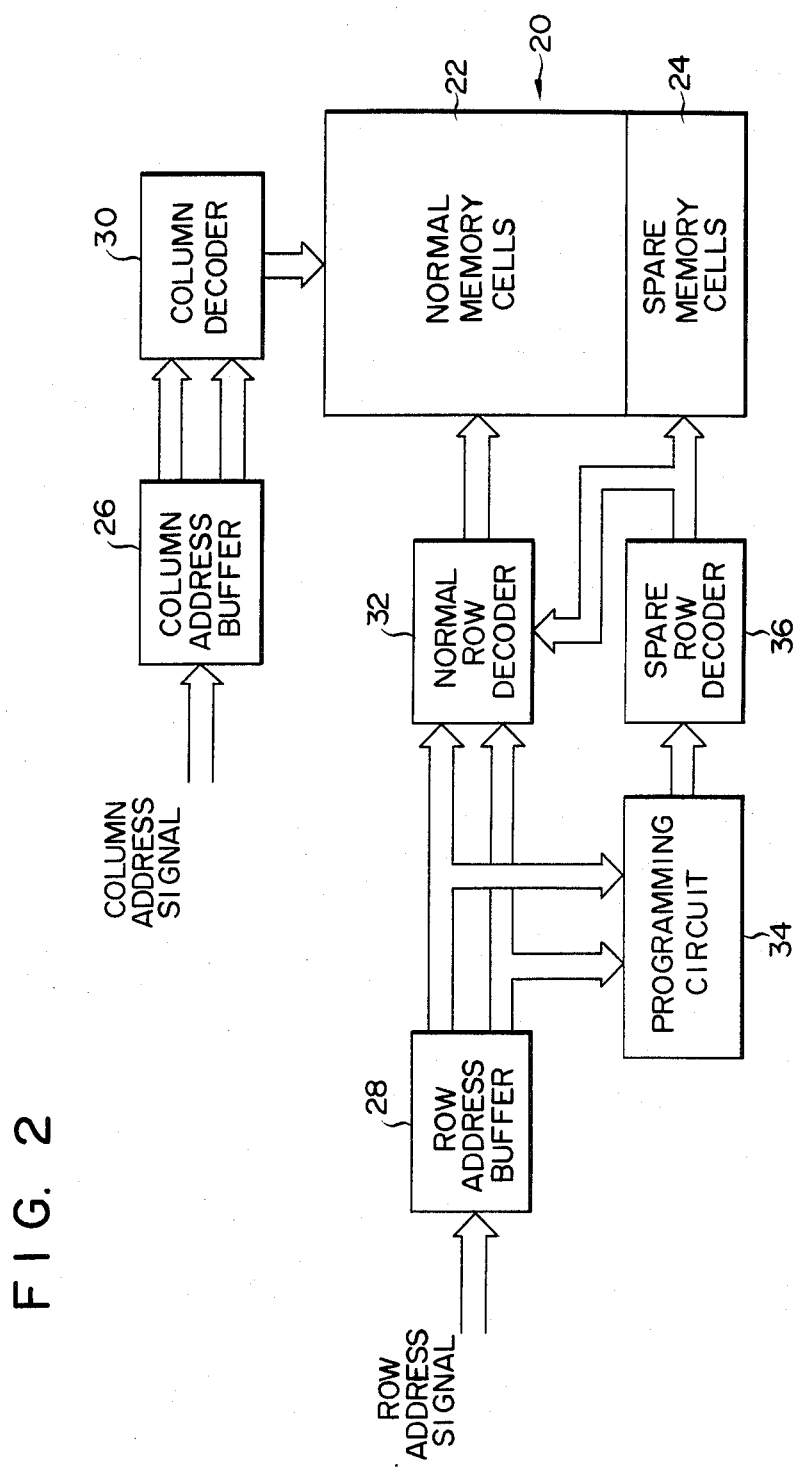
FIG. 2 is a block circuit diagram of a semiconductor memory device with a redundancy technique according to a first embodiment of the present invention.

Description is now given with the reference to the accompanying drawings of a semiconductor device in accordance with the present invention. FIG. 2 is a block diagram of a semiconductor memory device according to a first embodiment of the present invention. The respective blocks of FIG. 2 are formed on a single chip. A memory cell unit 20 comprises normal memory cells 22 and spare memory cells 24. In the embodiment of FIG. 2 it is assumed that the normal memory cells 22 are arranged in the matrix form and the spare memory cells 24 correspond to several rows of the normal memory cells 22. The replacement of normal memory cells by spare memory cells is effected for each row.

A column address signal is supplied to a column address buffer 26, and a row address signal is supplied to a row address buffer 28. The address buffers 26 and 28 send forth an address signal and its inverted signal. An output signal from the column address buffer 26 is delivered to a column decoder 30, which in turn selects one column from among a plurality of memory cell columns. An output signal from the row address buffer 28 is supplied to a normal row decoder 32. An output signal from the normal row decoder 32 is sent forth to each row of the normal memory cells 22. An output signal from the row address buffer 28 is also supplied to a programming circuit 34 whose output signal is supplied to a spare row decoder 36. An output signal from a spare row decoder 36 is delivered to each row of the spare memory cells 24.

An output signal from the spare row decoder 36 is also supplied to the normal row decoder 32 as a decoding-inhibiting signal. Thus, data is read out from a memory cell positioned at a junction between a column selected by the column decoder 30 and a row selected by the normal row decoder 32 or spare row decoder 36.

Description is now given with reference to FIG. 3 of the detailed circuit arrangement of the programming circuit 34 and the spare row decoder 36. The spare row decoder 36 is formed of decoder units having the same number as the rows of the spare memory cells. An output signal from each row decoder unit is supplied to the corresponding row of spare memory cells. The programming circuit 34 consists of a plurality of programming units corresponding to the respective decoder units. FIG. 3 indicates a programming unit 34-1 and one of the decoder units designated as 36-I. Assuming an N-bit the programming unit 34-1 is chosen to comprise N selectors, 40-1 to 40-N, and a programming element 42. This programming element 42 is one of the elements on which this invention is fundamentally based. The selectors 40-1 to 40-N respectively include programming elements 44-1 to 44-N. However, it is unnecessary sometimes, as later described, to provide the programming element 42.

With the programming elements 42 and 44, a polysilicone fuse 46 is connected at one end of the power supply terminal VDD and at the other end is grounded through parallel-connected MOSFETs 48 and 50 (unless otherwise noted, the MOSFET is assumed to have an enhancement mode of the N-channel type). In programming element 44-1, the gate of the MOSFET 48 is supplied with a programming signal P1. The fuse 46 is connected at the other end to a program output signal line X1 and also to the gate of the MOSFET 50 through series-connected inverters 52, 54 and 56. The junction between the inverters 54 and 56 is grounded through a capacitor 58. The inverter 54 and capacitor 58 jointly constitute a delay circuit. An output terminal of the inverter 52 is connected to another program output signal line X1.

Each selector 40 is formed of a different programming element 44, constructed as described above, and MOSFETs 60 and 62 whose gates are respectively connected to the program output signal lines $\overline{X}$ and X (i.e., $\overline{X1}$-$\overline{XN}$ and X1-XN, respectively). The MOSFETs 60 and 62 are respectively supplied at one end with address signals $\overline{A}$ and A (i.e., A1-AN and A1-AN, respectively), and at the other end are jointly connected to an output line B (i.e., B1-BN). In other words, an output line B of the selector 40 is supplied with a corresponding address signal A or $\overline{A}$, depending on the physical condition of the corresponding fuse 46. Either output signal X or $\overline{X}$ from a programming element 42 or 44 is chosen to have a logic level "1", depending on the physical condition of the corresponding fuse 46.

Output signals B1 to BN from the selectors 40-1 to 40-N are respectively delivered to the gates of MOSFETs 64-1 to 64-N included in the decoder unit 36-I. Output signals X and $\overline{X}$ of the programming element 42 are respectively delivered to the gates of MOSFETs 66 and 68. The MOSFET 66 is connected at one end to the power source terminal VDD and at the other end is grounded through series-connected depression mode MOSFET 70 and the MOSFET 68. MOSFETs 64-1 to 64-N are connected in parallel between the junction of the MOSFETs 70 and 68 and the ground. The gate of the MOSFET 70 is connected to the junction of the MOSFETs 70 and 68. A signal from the junction of the MOSFETs 70 and 68 is delivered through a buffer 72 to one row of the spare memory cells 24 and to the normal row decoder 32.

The normal row decoder 32 (not shown) is constructed in the same manner as the spare row decoder 36. When a MOSFET, whose conduction is controlled by an output signal from the spare row decoder 36, is rendered conductive, an output signal is chosen to have a logic level "0".

Description is now given, with reference to FIGS. 2 and 3, of the operation of the first embodiment of this invention. Reference is first made to the operation of the programming elements 42 and 44. When a programming signal P is set at a logic level "1" at the time of programming, then the MOSFET 48 is rendered conductive, causing the fuse 46 to blow. When the programming signal P is set at a logic level "0", then the fuse 46 remains connected. When programming is brought to an end and power in supplied to the power source terminal VDD, then the input terminal potential of the inverter 56 retains a logic level "0" for a prescribed length of time due to the presence of the capacitor 58. Therefore, an output signal from the inverter 56, that is, the gate of the MOSFET 50 is held at a logic level "1" for a prescribed length of time after power is supplied. As a result, the MOSFET 50 is rendered conductive when power is supplied.

When the fuse 46 is blown and the MOSFET 50 is rendered conductive, the junction of the fuse 46 and MOSFET 48 is reliably set at a logic level "0". The logic level "1" is transmitted through the inverters 52 and 54 to the inverter 56. The length of time required for the transmission is defined to fall within the prescribed period of time during which the input terminal potential of the inverter 56 is set at a logic level "0" due to the capacitor 58. Therefore, when the fuse 46 is blown, the input terminal of the inverter 56 is always set at a logic level "0". When power is supplied, an output signal from the inverter 56 has a logic level "1", causing the MOSFET 50 to be rendered conductive. At this time the output signals X and $\overline{X}$ respectively have logic levels "1" and "0". When the fuse 46 is not blown and power is supplied, the junction of the fuse 46 and MOSFET 48 is at a logical level "1". However, when the fuse 46 is not blown and the MOSFET 50 is rendered conductive, then the resistance of the fuse 46 and MOSFET 50 is so defined as to cause the junction of the fuse 46 and MOSFET 50 to be set at a logic level "1". Even when, therefore, the MOSFET 50 is rendered conductive after power is supplied, the junction of the fuse 46 and MOSFET 50 is set at a logic level "1".

A signal of logic level "1" is transmitted after a prescribed delay to the gate of the MOSFET 50 through the inverters 52, 54 and 56 and capacitor 58, causing the gate to have a logic level "0". When the fuse 46 is not blown, the MOSFET 50 is rendered nonconductive in a prescribed length of time after power is supplied. As a result, the output signals X and $\overline{X}$ respectively have logic levels "0" and "1". Since, at this time, both MOSFETs 48 and 50 are rendered nonconductive, the possibility of current running through the fuse 46 is negated, as is the case with the conventional programming circuit. Consequently the fuse 46 is prevented from being blown by mistake, thereby increasing the reliability of data programmed in the programming elements 42 and 44.

When the fuse 46 is blown, and power is not supplied, the MOSFETs 48 and 50 are rendered nonconductive. Therefore, the junction of the fuse 46 and MOSFET 50 is brought to an electrically floating state. Since the potentials of the respective junctions are defined when power is supplied, however, the junction of the fuse 46 and MOSFET 50 may tend to have its potential raised to a logic level "1". That junction potential may also be rendered unstable due to the capacitive coupling between the junction of the fuse 46 and MOSFET 50 and any other nodes which might rise to a logic level "1" or due to the occurrence of noise when power is supplied. When the junction of the fuse 46 and MOSFET 50 is raised to a logic level "1" by mistake, without the capacitor 58, a signal having a logic level "1" is immediately transmitted to the gate of the MOSFET 50, which in turn is set at a logic level "0". As a result, erroneous data continues to be read out, until the junction of the fuse 46 and MOSFET 50 is discharged to a logic level "0", for example, by leakage. The provision of the capacitor 58 is intended to avoid this possible malfunction. As described above, the voltage of the gate of the MOSFET 50 is set at logic level "1" at the time power is supplied, causing the MOSFET 50 to be rendered conductive. When, therefore, the fuse 46 is blown, the voltage at the junction between the fuse 46 and the MOSFET 50 is set at logic level "0".

Description is now given with reference to FIGS. 2 and 3 of a semiconductor memory device according to the first embodiment of the invention. After the memory cells are fabricated, a search is made to detect any row of the normal memory cells 22 which contains a defective cell. Now let it be assumed that the spare memory cells 24 do not contain a defective bit. Description is now given of the case where an address signal has three bits and the row addressed "010" of the normal memory cells 22 contains a defective bit, and one row of the spare memory cells 24 is to be used in place of the row "010" containing a defective bit. At this time, a programming signal P having a logic level "1" is supplied to the programming element 42 included in the programming unit 34-1. As a result, the voltage of the output signals X and $\overline{X}$ from the programming element 42 are respectively set at logic levels "1" and "0". The MOSFETs 66 and 68 included in the decoder unit 36-1 are respectively rendered conductive and nonconductive. In other words, when one row of the spare memory cells 24 is used, the fuse of the programming element 42 is first blown.

Next, programming signals P1 to PN (N is defined as the number of address signal bits =3) to be supplied to the selectors 40-1 to 40-3 are designated in accordance with the address bits of the row of the normal memory cells which contains the defective cell. If an address bit has the corresponding logic level "1", then a programming signal is set at a logic level "1" and the address bit has a logic level "0", then the corresponding programming signal is set at a logic level "0". In the above-mentioned case, the row "010" of the normal memory cells is assumed to contain a defective bit. Therefore, a programming signal P2 supplied to the selector 40-2 is set at a logic level "1". As a result, the output signals X2 and $\overline{X2}$ from the programming element 44-2 included in the selector 40-2 are respectively set at logic levels "1" and "0", causing the MOSFETs 60 and 62 in that element to be respectively rendered conductive and nonconductive. Consequently, an input signal A2 is selected and the selector 40-2 sends forth an input signal A2 as an output signal B2.

Programming signals P1 and P3 supplied to the other selectors 40-1 and 40-3 are set at a logic level "0". The selectors 40-1 and 40-3 respectively issue the input signals A1 and A3 as output signals B1 and B3. Thus, the output signals B1, B2 and B3 from the respective selectors 40-1, to 40-2 and 40-3 are the signals A1, A2 and A3, respectively. When the row address signal becomes "010" the output signals from the programming unit 34-1 are all "0". When a defective row of the normal memory cells is addressed, the programming unit 34-1 is so programmed as to cause all of the output signals to be set at a logic level "0". The transistors 64-1, 64-2 and 64-3 included in the decoder unit 36-1 are all rendered nonconductive. The result is, the MOSFET 66 included in the decoder unit 36-1 is rendered conductive, and the other MOSFETs included in the decoder unit 36-1 are rendered nonconductive. Therefore, the junction between the MOSFETs 70 and 64 is at a logic level "1". As a result, an output signal of logic level "1" is sent forth from the decoder unit 36-1. The output signal of the logic level "1" is delivered to one row of the spare memory cells 24 and also to the normal row decoder 32. The normal row decoder 32, in response to a logic level "1" causes the output signals supplied in all the rows of the normal memory cells 22 to be set at a logic level "0". When an address signal denoting a previously programmed row is supplied to the programming unit 34-1, one row of the spare memory cells 24 is thus selected in place of one row of the normal memory cells 22.

When the programming unit 34-1 is programmed as described above, and the row address signal is not "010", one of the output signals from the selectors 40-1, 40-2 and 40-3 is set at a logic level "1", and consequently one of the MOSFETs 64-1, 64-2 and 64-3 is rendered conductive. Therefore, the junction between the MOSFETs 70 and 64 has a logic level "0". At this time, the decoder unit 36-1 produces an output signal having a logic level "0" and when the normal memory cells 22 are decoded, none of the spare memory cells 24 are used. In this case, since the MOSFET 70 is of the depletion mode, it is not particularly required to provide MOSFETs 66 and 68 different input signals.

Further, the number of inverters in the programming elements 42 and 44 need not be limited to three but need only be an odd number.

The nonvolatile memory element also need not be limited to the aforementioned fuse. Any type can be applied as the nonvolatile memory element, provided the impedance prevailing between both terminals can be changed in a nonvolatile manner. For example, a MNOS or FAMOS device may be used. An FAMOS-FET provided with a floating gate, has the drawbacks that if current constantly flows between the drain and source, impact ionization arises near its drain region and hot electrons are sometimes injected into the floating gate to vary the threshold voltage of the floating gate, thereby giving rise to the possibility of false data being produced. With a semiconductor device embodying this invention, however, current is not made to flow constantly through the memory element but runs only for a prescribed length of time after power is supplied. Therefore, the semiconductor device is not affected in any way by changes in the threshold voltage of the floating gate.

Furthermore, when the fuse is blown by an energy ray such as a laser beam, it is unnecessary to provide the programming MOSFET 48.

According to the aforementioned first embodiment of this invention, binary data are programmed without causing current always to flow through the fuse, thereby increasing the reliability of the programming element. Further when the normal memory cell turns defective, the spare cell is used by programming the defective address with the programming element. Consequently, a semiconductor device is manufactured with a high yield.

Figure 4:
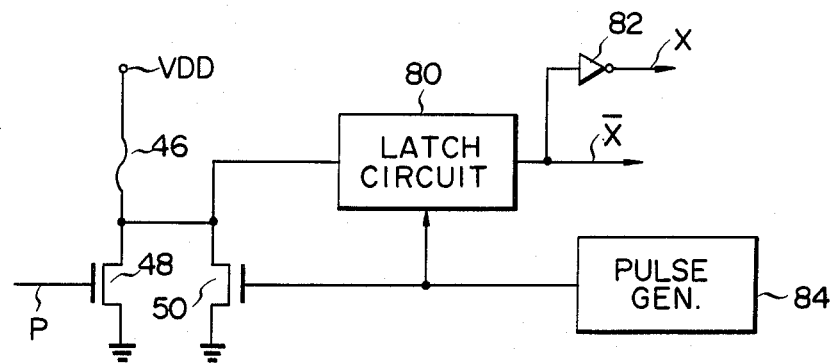
FIG. 4 illustrates the arrangement of a programming circuit according to another embodiment of the present invention.

Description is now given with reference to FIG. 4 of a semiconductor device according to another embodiments of the present invention. The reference numerals used in the first embodiment will be used for corresponding elements in FIG. 4 and in the other embodiments. FIG. 4 shows the circuit arrangement of programming elements 42 and 44 used with the second embodiment. The junction of the fuse 46 and programming MOSFET 48 is connected to an input terminal of a latch circuit 80. A programming output signal $\overline{X}$ is set forth from an output terminal of the latch circuit 80. An output signal X is transmitted from the output terminal of the latch circuit 80 through an inverter 82. An output signal from a pulse generator 84 which sends forth a pulse having a prescribed time width, when power is supplied, is supplied to the gate of the MOSFET 50 and the latch terminal of the latch circuit 80.

With the second embodiment, the fuse 46 is blown on the same occasion as described in the first embodiment. However, in the second embodiment, if the fuse is not blown, current runs through the fuse 46 only during the period in which the MOSFET 50 is rendered conductive by the pulse signal generated when power is supplied. As in the first embodiment, therefore, current does not always run through the fuse 46. Consequently, the fuse 46 is not blown by mistake, thereby enabling programming data to be highly reliable. The programmed data, i.e., the level of the junction between the fuse 46 and MOSFET 50 when the MOSFET 50 is conductive, is latched by the latch circuit 80, thereby enabling programming data to be reliably issued.

Figure 5:
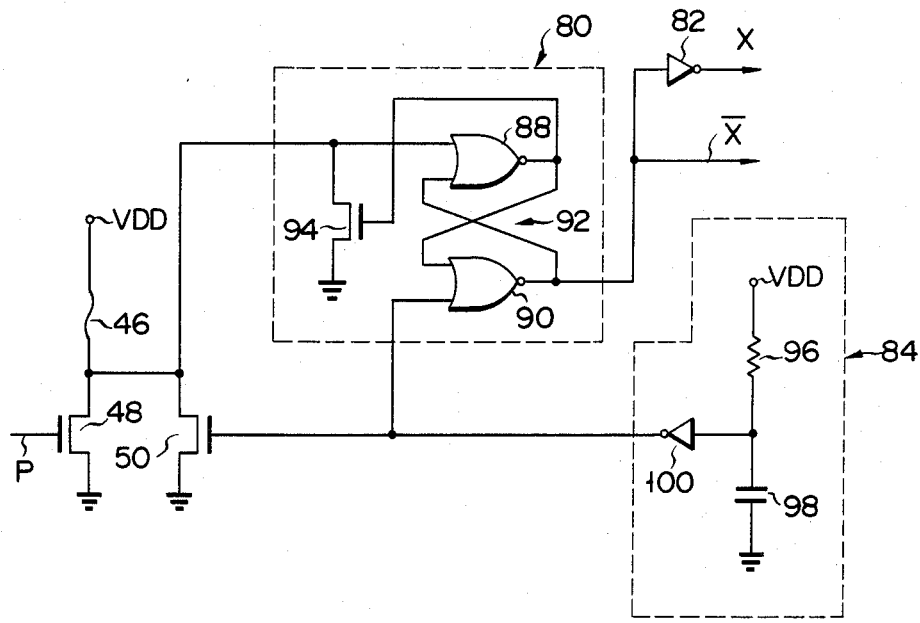

Description is now given with reference to FIGS. 5, 6, 7 and 8 of various actual circuit arrangements for the second embodiment. Referring to FIG. 5, a flip-flop circuit 92, consisting of a pair of cross-coupled NOR gates 88 and 90, is part of the latch circuit 80. NOR gates 88 and 90 are respectively supplied with an output signal from a junction between the fuse 46 and MOSFET 48 and an output signal from the pulse generator 84. MOSFET 90, whose gate is supplied with an output signal from the NOR gate 88, is connected between ground and the junction of the fuse 46 and MOSFET 48. An output signal from the NOR gate 90 is used as a programming output signal $\overline{X}$. The pulse generator 84 comprises a resistor 96 and capacitor 98 which are connected in series between the power supply terminal VDD and ground, and an inverter 100 which issues an output pulse obtained by inverting an output signal from the junction of the resistor 96 and capacitor 98.

When the aforementioned circuit is supplied with power VDD, the inverter 100 transmits a pulse of a logic level "1" having a prescribed pulse width determined by the values of resistor 94 and capacitor 98. The MOSFET 50 is rendered conductive for a prescribed length of time represented by the pulse width. When the fuse 46 is not blown at this time, the junction between the fuse 46 and MOSFET 50 has a logic level "1", causing an output signal from the NOR gate 88 to be set at a logic level "0". Even when the output level of the pulse generator 84 becomes a logic "0" and the MOSFET 50 is rendered nonconductive, the level of the junction between the fuse 46 and MOSFET 50 is still held at a logic "1". Therefore, an output signal from the NOR gate 88 is set at a logic level "0", and the NOR gate 90 is supplied with two input signals both having a logic level "0". An output signal $\overline{X}$ from the NOR gate 90 is set at a logic level "1".

When the fuse 46 is blown and the MOSFET 50 is rendered conductive, the junction between the fuse 46 and MOSFET 50 has a logic level "0". Since, at this time, an output signal from the NOR gate 90 is set at a logic level "0", an output signal from the NOR gate 88 is set at a logic level "1". As a result, the MOSFET 94 is rendered conductive, and one input terminal of the NOR gate 88 is stably held at logic level "0". The output terminal of the NOR gate 88 is thus held at a logic level "1". One input terminal of the NOR gate 90 is set at a logic level "1", causing an output signal from the NOR gate 90 to be set at a logic level "0". In other words, the programming output signal $\overline{X}$ is set at a logic level "0". Even when, therefore, an output signal from the pulse generator 84 is set at a logic level "0" and the MOSFET 50 is rendered nonconductive, an output signal from the NOR gate 88 is set at a logic level "1".

Figure 6:
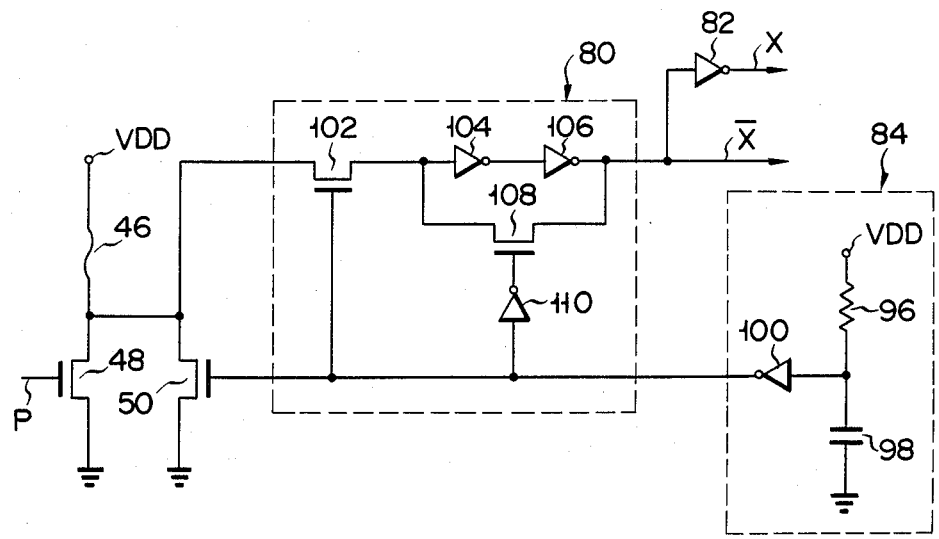

The circuit arrangement of another embodiment shown in FIG. 6 comprises a latch circuit 80 which has a different arrangement from that of FIG. 5. Namely, the latch circuit 80 comprises a MOSFET 102 and inverters 104 and 106 connected in series between the input terminal and output terminal $\overline{X}$ in the order mentioned, a MOSFET 108 connected in parallel with the inverters 104 and 106 and an inverter 110 which inverts an output signal from the pulse generator 84 and supplies the inverted signal to the gate of the MOSFET 108. The gate of the MOSFET 102 is supplied with an output signal from the pulse generator 84.

While the pulse signal is produced from the pulse generator 84, the MOSFETs 50 and 102 are rendered conductive. Therefore, the voltage level of the junction between the fuse 46 and MOSFET 50, which varies according to whether the fuse 46 is blown or not, appears at the output terminal of the inverter 106. When the pulse signal ceases, the MOSFETs 50 and 102 are rendered nonconductive, and the MOSFET 108 is rendered conductive. Therefore, an output signal from the inverter 106 is supplied to an input terminal of the inverter 104 through the MOSFET 108 and the output signal from the inverter 106 remains set at the same logic level during this time period.

Figure 7:
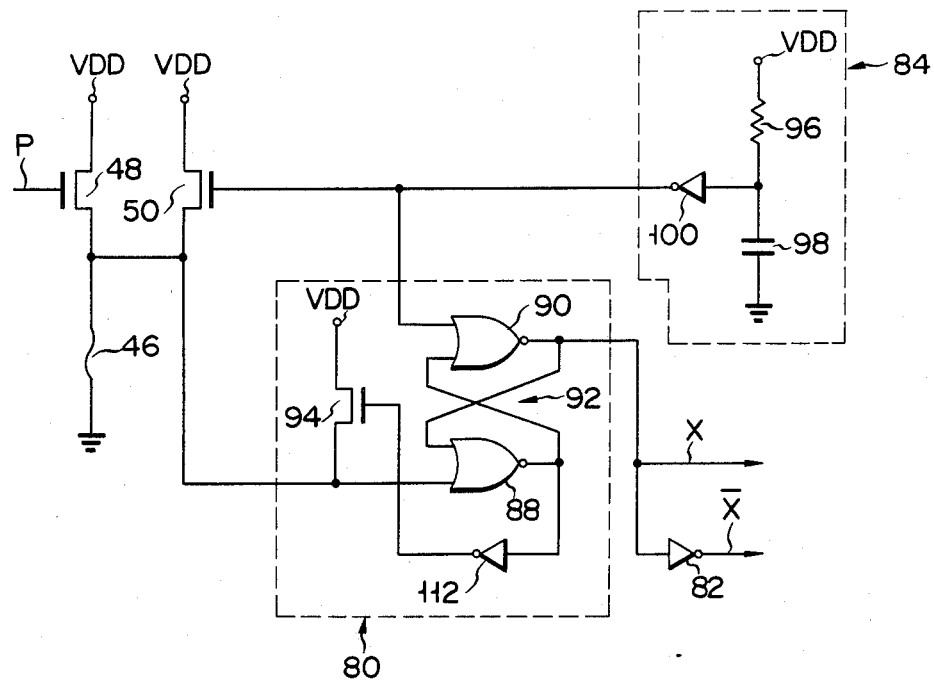

FIG. 7 shows the actual circuit arrangement of another embodiment. This circuit has substantially the same arrangement as FIG. 5, but is different therefrom in that it has a voltage of opposite polarity than that of FIG. 5. As a result, the output signal from the NOR gate 88 is supplied to the gate of the MOSFET 94 through an inverter 112. When, therefore, the fuse 46 is blown, the junction between the fuse 46 and MOSFET 48 is set at a logic level "1".

FIG. 8 shows a circuit arrangement of a modification of the pulse generator 84. The pulse generator indicated in FIGS. 5, 6 and 7 has the potential drawback that when the power source voltage rise gently, a pulse signal may not generated. However, the pulse generator of FIG. 8 has the advantage that even when the power source voltage rises gently, a pulse signal is generated without fail.

Description is now given with reference to FIG. 9 of the circuit arrangement of a programming element according to another embodiment of this invention. A fuse 130 and capacitor 132 are connected in series between ground and one ouput terminal X of a flip-flop circuit 128 consisting of MOSFETs 120 and 122 and depletion mode MOSFETs 124 and 126. A capacitor 134 is connected between ground and the other output terminal $\overline{X}$ of the flip-flop circuit 128. In this case the capacitor 132 has a larger capacity than the capacitor 134. With this embodiment, the fuse 130 is blown by laser beams. The condition in which the fuse 130 is blown or not blown is decided in the same manner as previously described.

When the fuse 130 is blown, the output terminal X and capacitor 132 are separated from each other. Therefore, when power VDD is supplied, the output terminal X has a higher potential than that of the output terminal $\overline{X}$. As a result, the MOSFET 122 is rendered conductive, and the MOSFET 120 is rendered nonconductive, causing the output terminals X and $\overline{X}$ respectively to have logic levels "1" and "0". If the fuse 130 is not blown and power VDD is supplied, the output terminal $\overline{X}$ is charged earlier and has a higher potential than the output terminal X. At this time, the MOSFET 120 is rendered conductive and the MOSFET 122 is rendered nonconductive. The output terminals X and $\overline{X}$ are respectively set at logic levels "0" and "1". Thus it is possible to produce programming output signals X and $\overline{X}$ having the same logic levels as those obtained in the aforementioned embodiments. When the fuse 130 is connected, current flows through the fuse 130 only for the length of time extending from the point in time when power VDD is supplied to the point in time when the MOSFET 120 is rendered conductive to stabilize the flip-flop circuit 128. Therefore, very reliable data is obtained.

With the programming element of FIG. 9, it is also possible to connect another fuse between the output terminal $\overline{X}$ and capacitor 134 and cause either fuse to be blown according to the contents of the programming data. Further, it is possible to replace the fuse 130 by highly resistive polysilicon 140 as shown in FIG. 10. In this case, the polysilicon 140 is used as it is when the programming data represents that the fuse is blown and is used after laser annealing when the programming data represents that the fuse is not blown. The resistance of the polysilicon 140 is reduced by laser annealing.

Figure 11:
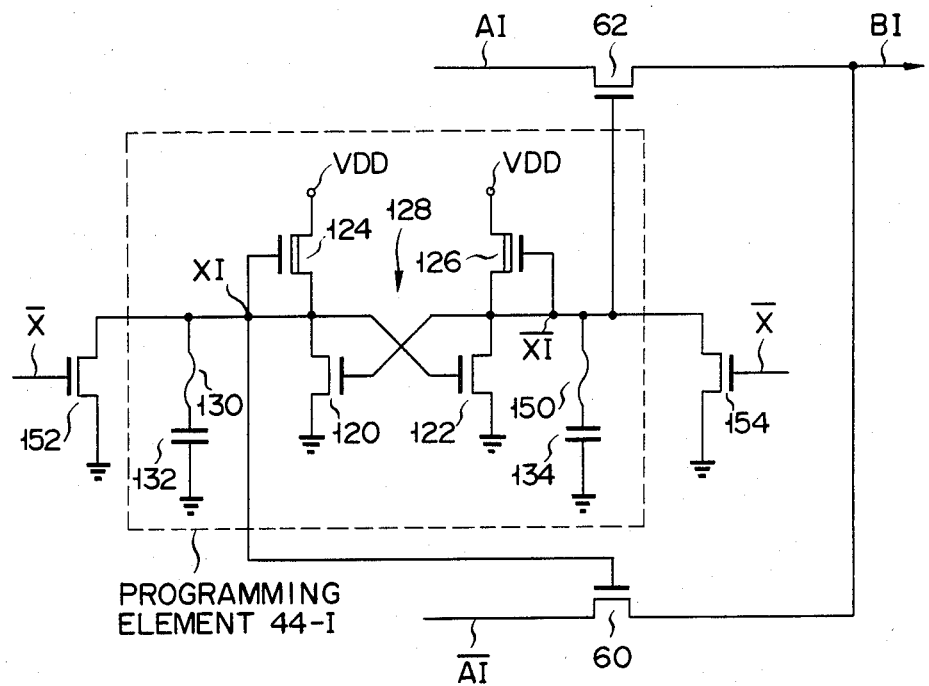

Description is now given with reference to FIG. 11 of a selector 40 using a programming element 44 of the third embodiment. A typical programming element 44-I is a combination of the circuit of FIG. 9 and a fuse 150 connected between the output terminal $\overline{XI}$ and capacitor 134 of the circuit. Of course, it is possible to use the circuit of FIG. 9 as shown. In FIG. 11, an output terminal XI is connected to the gate of an MOSFET 60 and grounded through an MOSFET 152. An output terminal $\overline{XI}$ is connected to the gate of an MOSFET 62, and grounded through an MOSFET 154. An output signal X from the programming element 42 is supplied to the gates of the MOSFETs 152 and 154. When spare memory cells are used, the output signal $\overline{X}$ is set at a logic level "0", and the MOSFETs 152 and 154 are rendered nonconductive.

Either fuse 130 or 150 of the programming element 44-I is blown by laser beams according to the defective address signal. If, in this case, an address signal AI is a logic level "1", the fuse 130 is blown. As a result, the output terminal $\overline{XI}$ has a larger capacity than the output terminal XI. When power VDD is supplied, the output terminal XI is set at a logic level "1". The MOSFET 60 is conductive. The selector 40-I transmits the input signal $\overline{AI}$ as an output signal BI. When a defective address is accessed, the output signal BI is set at a logic level "0".

When no spare memory cell is used, the MOSFETs 152 and 154 are rendered conductive, and MOSFETs 60 and 62 are rendered nonconductive. The output signal BI is not stable, but the signal $\overline{X}$ is set at a logic level "1". Therefore, the MOSFET 68 of the decoder unit 36-I shown in FIG. 3 is rendered conductive, and an output signal from the decoder unit 36-I is set at a logic level "0".

Description is now given with reference to FIGS. 12A and 12B of another embodiment comprising CMOS elements. FIG. 12A shows circuit arrangement of typical selector 40-I of FIG. 3. FIG. 12B indicates the circuit arrangement of a typical decoder unit 36-I of FIG. 3. The selector 40-I comprises a programming element consisting of a flip-flop circuit 168 containing P channel MOSFETs 160 and 162 and N channel MOSFETs 164 and 166. The output terminal XI of the flip-flop circuit 168 is grounded through a fuse 170 and capacitor 172, and connected to the gate of an N channel MOSFET 174. The output terminal $\overline{XI}$ of the flip-flop circuit 168 is grounded through a capacitor 176, and connected to the gate of an N channel MOSFET 178. Address signals AI, $\overline{AI}$ are respectively supplied to MOSFETs 178 and 174 at one end. These MOSFETs 178 and 174 are connected to an output line BI at the other ends.

As shown in FIG. 12B, the decoder unit 36-I comprises P channel MOSFETs 180-1 to 180-N connected in parallel between the output terminal OUT and power supply terminal VDD, and N channel MOSFETs 182-1 to 182-N connected in series between the output terminal OUT and ground. The output terminal OUT is connected to the corresponding row of the spare memory cells 24 through an inverter 184. The gates of the MOSFETs 180-1 to 180-N are respectively supplied with input signals B1 to BN from the selectors 40-I, I=1,N. The gates of the MOSFETs 182-1 to 182-N are also respectively supplied with output signals B1 to BN.

With the embodiment of this invention shown in FIGS. 12A and 12B which is arranged as described above, no current normally flows through the fuse 170 nor through the flip-flop circuit 168 when it is stabilized. This embodiment of the invention thus enhances the effect of reducing power consumption due to the provision of the CMOS circuit. When the output signals B1 to BN from the selectors 40-I are all set at a logic level "1", then the output terminal OUT is set at a logic level "0", causing a signal having a logic level "1" to be transmitted from the inverter 184.

Figure 13:
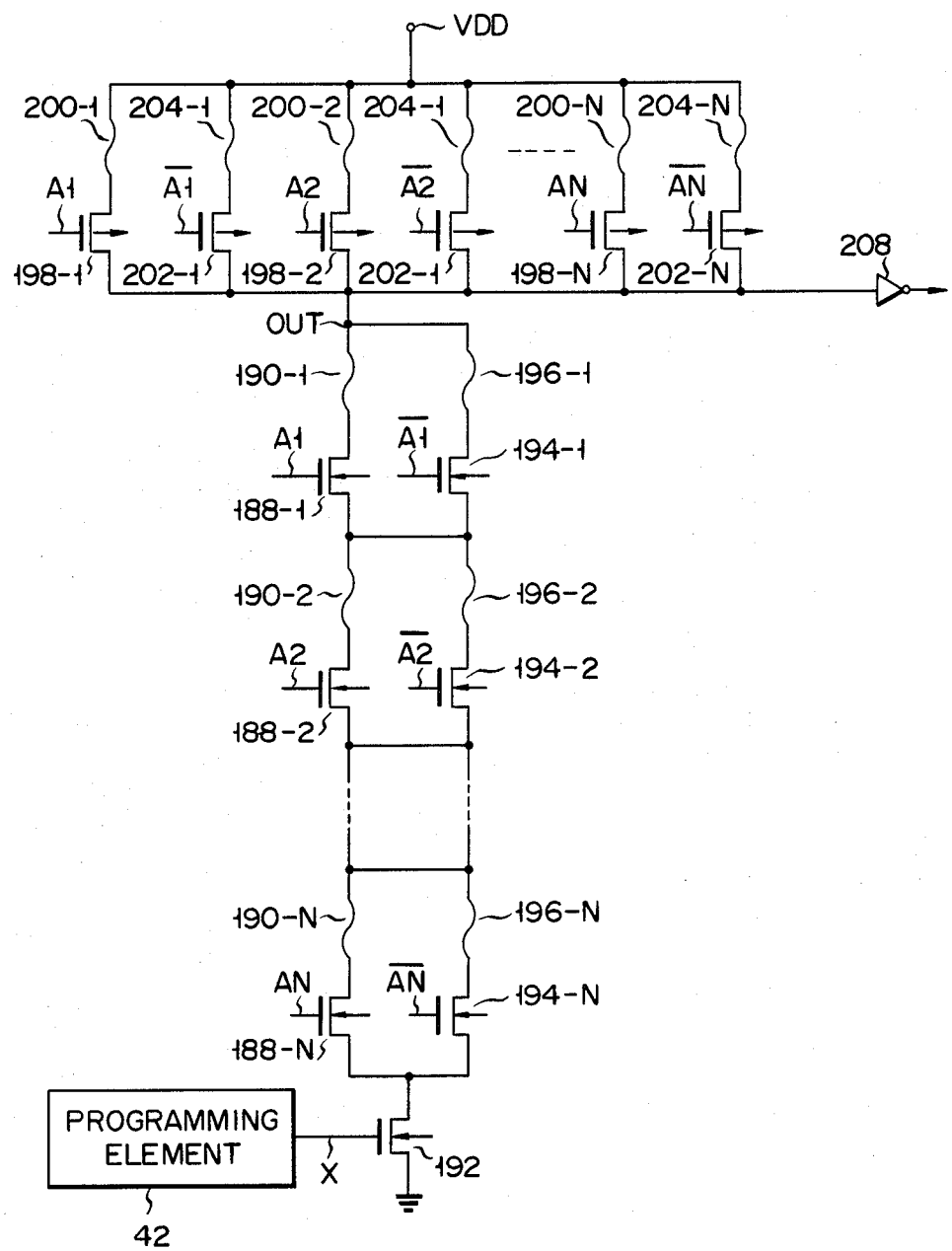
FIG. 13 sets forth the arrangements of a programming circuit and a spare decoder according to still another embodiment of the present invention.

Description is now given with reference to FIG. 13 of the arrangement of yet another embodiment of this invention. In this embodiment a typical programming unit 34-I of FIG. 3 and a typical decoder unit 36-1 of FIG. 13 are assembled into one system. A series circuit consists of N channel MOSFETs 188-I (I=1,N), whose gates are supplied with the corresponding address signals AI, fuses 190-I, and an N channel MOSFET 192 whose gate is supplied with an output signal X from the programming element 42. These elements are connected in series between the output terminal OUT and ground. Another series circuit, consisting of N channel MOSFETs 194-I, whose gates are supplied with the address signals $\overline{AI}$, and fuses 196-I is connected between the output terminal OUT and MOSFET 192 in parallel with the series connection of MOSFETs 188-I and fuses 190-I. The circuits each consisting of one of the P channel MOSFETs 198-I, whose gates are each supplied with one of the corresponding address signals AI, connected in series with the corresponding one of fuses 200-I are connected in parallel between VDD and the output terminal OUT. The circuits each consising of one of the P channels MOSFETs 202-I, whose gates are supplied with one of the corresonding address signals $\overline{AI}$, connected in series with the corresponding one of the fuses 204-I are also connected in parallel between the output terminal OUT and power supply terminal VDD. The output terminal OUT is connected to the corresponding row of the spare memory cells 24 through an inverter 208.

With the embodiment of FIG. 13, either fuses 190-I or 196-I and either fuses 200-I or 204-I are blown by laser beams according to the address signal of a defective bit. When the defective address bit is of a logic level "1", then the fuses 196-I and 204-I are blown. When the defective address bit is of a logic level "0", then fuses 190-I and 200-I are blown. Therefore only when the defective address signal is supplied, is the output terminal OUT set at a logic level "0", causing the inverter 208 to transmit a signal of a logic level "1". IF, in this case, no spare decoder is used, the output signal X from the programming element 42 is set at a logic level "0". Even when, therefore, the MOSFETs 198 and 202 or MOSFETs 188 and 194 are supplied with an address signal having the opposite phase, the MOSFET 192 remains nonconductive. Therefore, no current is consumed in the spare decoder, nor does any current flow through the fuse element.

Furthermore, when the spare decoder is used, the output signal X from the programming element 42 is set at a logic level "1" causing the MOSFET 192 to be rendered conductive. At this time, either fuse 190 or 196 and either fuse 200 or 204 are blown. By using a spare decoder consisting of a CMOS element, current flows only when an address signal is changed, thereby preventing current from normally running through the fuse element.

When binary data is stored in a nonvolatile memory element, this invention eliminates, as described above, the necessity of continuous current flow through the nonvolatile memory element, thereby providing a semiconductor device which enables highly reliable data to be stored in the nonvolatile memory element.

What we claim is:

1. A semiconductor device which comprises:
first and second power terminals;
memory means having an impedance capable of being set at one of two levels in a nonvolatile state;
MOSFET switching means connected in series with said memory means between said first and second power supply terminals, said switching means including a gate; and
control means connected between said gate of said MOSFET switching means and the junction of said memory means and said MOSFET switching means for controlling the conduction of said switching means according to the voltage at the junction between said memory means and said switching means, said control means including an odd number of series-connected inverters and a capacitor connected between one of said power terminals and an output terminal of one of said inverters.

2. A semiconductor device which comprises:
first and second power supply terminals
memory means having an impedance capable of being set at one of two levels in a nonvolatile state;
switching means connected in series with said memory means between said first and second power supply terminals, said switching means including a control terminal for receiving signals that control the conductivity of said switching means;
a first input terminal coupled to the junction between said memory means and said switching means;
pulse generator means coupled to said switching means for generating a pulse from an output terminal to said control terminal of said switching means;
a second input terminal connected to said output terminal of said pulse generator means; and
latch means, coupled to said memory means, said switching means and said pulse generator means, for latching the voltage level at said first input terminal upon receipt at said second input terminal of said pulse from said pulse generator means, said latch means including a flip-flop circuit comprising a pair of NOR gates, and a MOSFET connected between one of said power supply terminals and said first input terminal and having a gate coupled to said flip-flop circuit.

3. A semiconductor device comprising:
first and second power supply terminals;
memory means having an impedance capable of being set at one of two levels in a nonvolatile state;
switching means connected in series with said memory means between said first and second power supply terminals, said switching means including a control terminal for receiving signals that control the conductivity of said switching means;
pulse generator means coupled to said switching means for generating a pulse from an output terminal to said switching means control terminal; and
latch means, coupled to said memory means, said switching means and said pulse generator means for latching the voltage level at the junction of said memory means and said switching means, said latch means including an even number of inverters connected in series to an output terminal of said latch means, a first MOSFET having a gate and whose conduction path is connected between said inverters and said junction between said memory means and said switching means, and a second MOSFET having a gate and being connected in parallel with said even number of inverters, and wherein said pulse generator means output is coupled to the gate of the first MOSFET and is also coupled through an output inverter to the gate of the second MOSFET.

4. An semiconductor device which comprises:
flip-flop circuit means having first and second output terminals;
memory means having an impedance which is capable of being set at one of two levels in a nonvolatile state;
first capacitance means coupled to the first output terminal of said flip-flop circuit means and to said memory means; and
second capacitance means connected to the second output terminal of said flip-flop circuit means and having a different capacitance value from that of said first capacitance means.

5. A semiconductor device according to claim 4, wherein said flip-flop circuit means comprises CMOS elements.

6. A semiconductor device according to claim 4, wherein said memory means includes a polysilicon fuse capable of being blown by laser beams.

7. A semiconductor device according to claim 4, wherein said memory means is formed of a polysilicon resistor whose resistivity is capable of being reduced by laser annealing.

8. A semiconductor device according to claim 4, wherein said second capacitance means is connected to the second output terminal of the flip-flop circuit through said memory means.

9. A semiconductor memory device responsive to an address signal which comprises:
normal memory cells;
spare memory cells;
normal decoder means coupled to said normal memory cells for selecting one of said normal memory cells according to said address signal;
spare decoder means coupled to said spare memory cells and said normal decoder means for selecting one of said spare memory cells and for inhibiting said normal decoder means; and
programming means coupled to said spare decoder means for programming the selection of said spare decoder means, said programming means including first and second power supply terminals,
memory means having an impedance capable of being set at one of two levels in a nonvolatile state,
switching means connected to said memory means in series between said first and second power supply terminals,
control means coupled to the junction of said memory means and said switching means and to an input of said switching means for controlling the conduction of said switching means according to the voltage of the junction between said memory means and said switching means, said control means including delay means between said junction and said switching means input, and
selector means coupled to said control means and said spare decoder means for supplying a signal to said spare decoder means according to the voltage at the junction between said memory means and said switching means.

10. A semiconductor memory device according to claim 9, wherein said switching means comprises an N channel MOSFET having a gate and connected to said memory means and wherein said control means includes an odd number of series-connected inverters coupled to the junction between said memory means and said MOSFET for supplying an inverted signal to the gate of the N channel MOSFET, and a capacitor connected between one of said supply terminals and an output terminal of one of said odd number of inverters.

11. A semiconductor memory device according to claim 9, wherein said memory means comprises a polysilicon fuse connected to said switching means and a switch connected between the junction of said polysilicon fuse and said switching means and said second power supply terminal such that said polysilicon fuse is blown when the switch is rendered conductive.

12. A semiconductor memory device responsive to an address signal which comprises:
normal memory cells;
spare memory cells;
normal decoder means coupled to said normal memory cells for selecting one of said normal memory cells according to said address signals;
spare decoder means coupled to said spare memory cells and said normal decoder means for selecting one of said spare memory cells and for inhibiting said normal decoder means; and
programming means coupled to said spare decoder means for programming the selection of said spare decoder means, said programming means including
first and second power supply terminals,
memory means having an impedance capable of being set at one of two levels in a nonvolatile state,
switching means connected to said memory means in series between said first and second power supply terminals and having a control terminal for receiving signals that control the conductivity of said switching means,
pulse generator means for generating a pulse at an output terminal of said pulse generating means to said control terminal of said switching means, and
latch means for latching the voltage level at the junction between said memory means and said switching means upon receipt of said pulse from said pulse generator means.

13. A semiconductor memory device according to claim 12, wherein said latch means comprises a flip-flop circuit including a pair of NOR gates, a first input terminal connected to the junction between said memory means and said switching means, a second input terminal connected to the output terminal of said pulse generator means, and a MOSFET connected between one of said power supply terminals and the first input terminal and having a gate coupled to said flip-flop circuit.

14. A semiconductor memory device according to claim 12, wherein said latch means comprises an even number of inverters connected in series to an output terminal of said latch means, a first MOSFET having a gate and a conduction path connected between said inverters and the junction between said memory means and said switching means, and a second MOSFET having a gate and being coupled to said even number of inverters, and wherein said output terminal of said pulse generator means is coupled to the gate of the first MOSFET and is also coupled through an output inverter to the gate of the second MOSFET.

15. A semiconductor memory device according to claim 12, wherein said memory means comprises a polysilicon fuse connected to said switching means and a switch connected between the junction of said polysilicon fuse and said switching means and the second power supply terminal such that said polysilicon fuse is blown when the switch is rendered conductive.

16. A semiconductor memory device responsive to an address signal which comprises:

normal memory cells;

spare memory cells;

normal decoder means coupled to said normal memory cells for selecting one of said normal memory cells according to said address signal;

spare decoder means coupled to said normal decoder means and to said spare memory cells for selecting one of said spare memory cells and for inhibiting said normal decoder means;

memory means having an impedance capable of being set at one of two levels in a nonvolatile state; and programming means coupled to said memory means and said spare decoder means for programming the selection of said spare decoder means, said programming means including flip-flop circuit means having first and second output terminals, first capacitance means connected to the first output terminal of said flip-flop circuit means said coupled to said memory means, and second capacitance means connected to the second output terminal of said flip-flop circuit means and having a different capacitance value from that of the first capacitance means.

17. A semiconductor memory device according to claim 16, wherein said flip-flop circuit means includes CMOS circuits.

18. A semiconductor memory device according to claim 16, wherein said memory means includes a polysilicon fuse capable of being blown by laser beams.

19. A semiconductor memory device according to claim 16, wherein said memory means includes a polysilicon resistor whose resistivity capable of being reduced by laser annealing.

20. A semiconductor memory device according to claim 16, wherein said second capacitance means is connected to the second output terminal of the flip-flop circuit means and to said memory means.

21. A semiconductor memory device responsive to an address signal and an inverted address signal which comprises:

normal memory cells;

spare memory cells;

normal decoder means coupled to said normal memory cells for selecting one of said normal memory cells according to said address signal;

spare decoder means coupled to said spare memory cells and said normal decoder means for selecting one of said spare memory cells and for inhibiting said normal decoder means; and programming means coupled to said spare decoder means for programming the selection of said spare decoder means, said programming means including a first power supply terminal, an output terminal, a plurality of first circuits each comprising a first fuse connected to a MOSFET having a first channel and a gate receiving at least a portion of said address signal, a plurality of second circuits each comprising a second fuse connected to a MOSFET having said first channel and a gate receiving at least a portion of said inverter address signal, said plurality of first and second circuits being connected in parallel between said first power supply terminal and said output terminal, a plurality of third circuits each comprising a third fuse connected to a MOSFET having a second channel and a gate receiving at least a portion of said address signal, and a plurality of fourth circuits each comprising a fourth fuse connected to a MOSFET having said second channel and a gate receiving at least a portion of said inverted address signal, each said third circuit being connected in parallel and in parallel with each said fourth circuit, one of said first and third fuses and one of said second and fourth fuses being blown in accordance with a signal representing a defective normal memory cell.

* * * * *